(12) United States Patent
Dunn et al.

(10) Patent No.: US 9,470,924 B2
(45) Date of Patent: Oct. 18, 2016

(54) FIGURE EIGHT CLOSED LOOP COOLING SYSTEM FOR ELECTRONIC DISPLAY

(71) Applicant: Manufacturing Resources International, Inc., Alpharetta, GA (US)

(72) Inventors: William Dunn, Alpharetta, GA (US); Kevin O'Connor, Duluth, GA (US)

(73) Assignee: Manufacturing Resources International, Inc., Alpharetta, GA (US)

(*) Notice: Subject to any disclaimer, the term of this patent is extended or adjusted under 35 U.S.C. 154(b) by 135 days.

(21) Appl. No.: 14/326,059

(22) Filed: Jul. 8, 2014

(65) Prior Publication Data

US 2015/0009627 A1   Jan. 8, 2015

Related U.S. Application Data

(60) Provisional application No. 61/843,706, filed on Jul. 8, 2013.

(51) Int. Cl.
*G02F 1/1333* (2006.01)

(52) U.S. Cl.
CPC .............. *G02F 1/133382* (2013.01)

(58) Field of Classification Search
CPC  G06F 1/20; H05K 7/20145; H05K 7/20972; G02F 1/133382; G02F 1/133385; G02F 2201/36; G02F 2001/133628
USPC ............... 361/694–697; 165/9.3, 104.34
See application file for complete search history.

(56) References Cited

U.S. PATENT DOCUMENTS

| 4,921,041 A  * | 5/1990  | Akachi ................. F28D 15/00 165/104.14 |
| 7,813,124 B2   | 10/2010 | Karppanen |
| 8,823,916 B2 * | 9/2014  | Hubbard ........... G02F 1/133308 165/104.34 |
| 2009/0126906 A1 | 5/2009 | Dunn |
| 2011/0013114 A1 | 1/2011 | Dunn et al. |
| 2011/0085301 A1 | 4/2011 | Dunn |
| 2012/0106081 A1 * | 5/2012 | Hubbard ........... G02F 1/133308 361/696 |
| 2012/0249402 A1 | 10/2012 | Kang |

* cited by examiner

*Primary Examiner* — Anthony Haughton
(74) *Attorney, Agent, or Firm* — Standley Law Group LLP

(57) ABSTRACT

The exemplary embodiments herein provide a figure eight closed loop of circulating gas pathways wrapping around an electronic display. One or more open loop ambient air pathways may pass through the figure eight but do not allow the circulating gas and the ambient air to mix. In some embodiments, the open loop ambient air pathway travels along a rear surface of the electronic display. In some embodiments, the circulating gas pathways contain a front channel placed in front of the electronic display, a rear channel placed behind the electronic display, and a center channel placed between the front and rear channels. Pass-through apertures may be placed within the path of the circulating gas and/or the ambient air to allow the paths of the two gaseous matters to cross without allowing them to mix with one another.

20 Claims, 7 Drawing Sheets

FIGURE EIGHT CLOSED LOOP COOLING SYSTEM FOR ELECTRONIC DISPLAY

CROSS-REFERENCE TO RELATED APPLICATIONS

This application claims priority to U.S. Provisional Application No. 61/843,706 filed on Jul. 8, 2013 which is herein incorporated by reference in its entirety.

TECHNICAL FIELD

Embodiments generally relate to cooling systems for electronic displays.

BACKGROUND OF THE ART

Electronic displays are sometimes used in outdoor environments or other areas where the surrounding temperatures may be high or there may be other sources of heat such as solar loading causing the temperatures within the display to rise. However, some portions of the display can be difficult to cool as simply ingesting ambient air into some portions of the display can introduce dust and contaminates into sensitive portions of the display, which can lead to premature failures.

SUMMARY OF THE EXEMPLARY EMBODIMENTS

Exemplary embodiments provide a figure eight closed loop circulating gas path which defines a center channel for the closed loop of circulating gas. A pair of open loop ambient air channels may be placed on opposite sides of the center channel, in order to remove heat from at least the center channel and the closed loop circulating gas. One or more open loop ambient air pathways may pass through the figure eight but do not allow the circulating gas and the ambient air to mix. In some embodiments, the open loop ambient air pathway travels along a rear surface of the electronic display. In some embodiments, the circulating gas pathways contain a front channel placed in front of the electronic display, a rear channel placed behind the electronic display, and a center channel placed between the front and rear channels. Pass-through apertures may be placed within the path of the circulating gas and/or the ambient air to allow the paths of the two gaseous matters to cross without allowing them to mix with one another.

The foregoing and other features and advantages of the present invention will be apparent from the following more detailed description of the particular embodiments, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Figure 1:
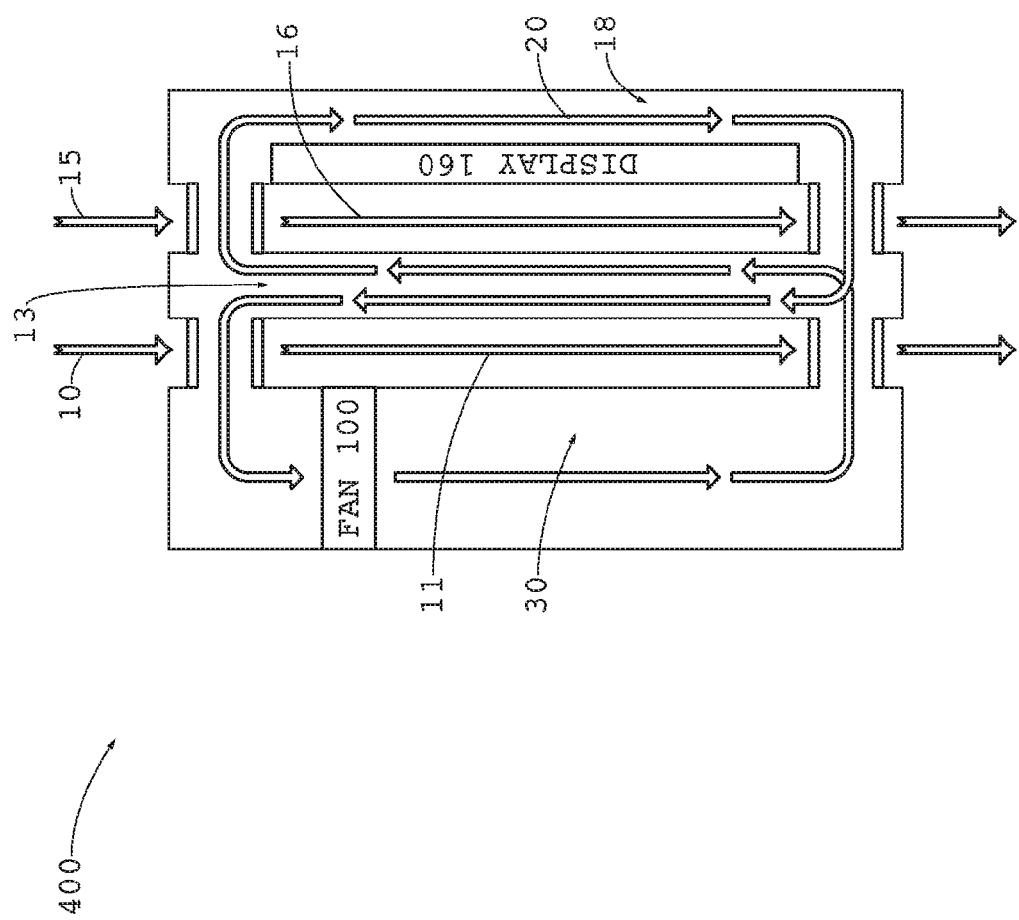
FIG. 1 is a simplified illustration of an exemplary embodiment of the figure eight closed loop cooling system.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a simplified illustration of an exemplary embodiment of the figure eight closed loop cooling system 400. This exemplary embodiment contains a plurality of channels in the assembly. The front channel 18 is placed in front of the display 160 and preferably allows closed loop circulating gas 20 to remove heat from the front of the display 160. The front open loop channel 16 is positioned behind the display 160 and preferably allows open loop air 15 to pass behind the display 160, removing heat at least from the rear portion of the display 160 and the center channel 13. The center channel 13 is preferably positioned between the front open loop channel 16 and the rear open loop channel 11 and allows closed loop circulating gas 20 to cross paths with itself (creating the figure eight) and to cross paths with the open loop air 10 and 15 without allowing the closed loop circulating gas and open loop air to mix.

The rear open loop channel 11 is preferably positioned immediately adjacent to the center channel 13, and allows open loop air 10 to flow through, thereby removing heat from the center channel 13 (and/or the closed loop circulating gas 13 contained within) and the rear channel 30. The rear channel 30 is positioned near the rear of the display and may contain various electronic components 35 for operating the overall display assembly, fans, or the display 160 itself.

In an exemplary embodiment, the front channel 18, center channel 13, and rear channel 30 are in sealed gaseous communication with each other. In other words, these channels do not permit closed loop circulating gas 20 to substantially escape or to allow ambient air or open loop air to enter these channels. Also in an exemplary embodiment, open loop air 10 and 15 is simply ambient air surrounding the display assembly. However, in some embodiments the open loop air 10 and 15 may be treated in some way (ex. filtered, air conditioned, or pre-cooled in some way) prior to being ingested into the display assembly. In this particular embodiment, the closed loop fan 100 is positioned within the rear channel 30, although this is not required. All that is required is that the closed loop fan 100 is positioned to force the closed loop circulating gas 20 through the front channel 18, center channel 13, and rear channel 30. The closed loop circulating gas 20 can be any gaseous matter that preferably does not contain large amounts of particulate. However, it does not have to be pure gas of any type; simple clean air works fine with the exemplary embodiments.

Figure 2:
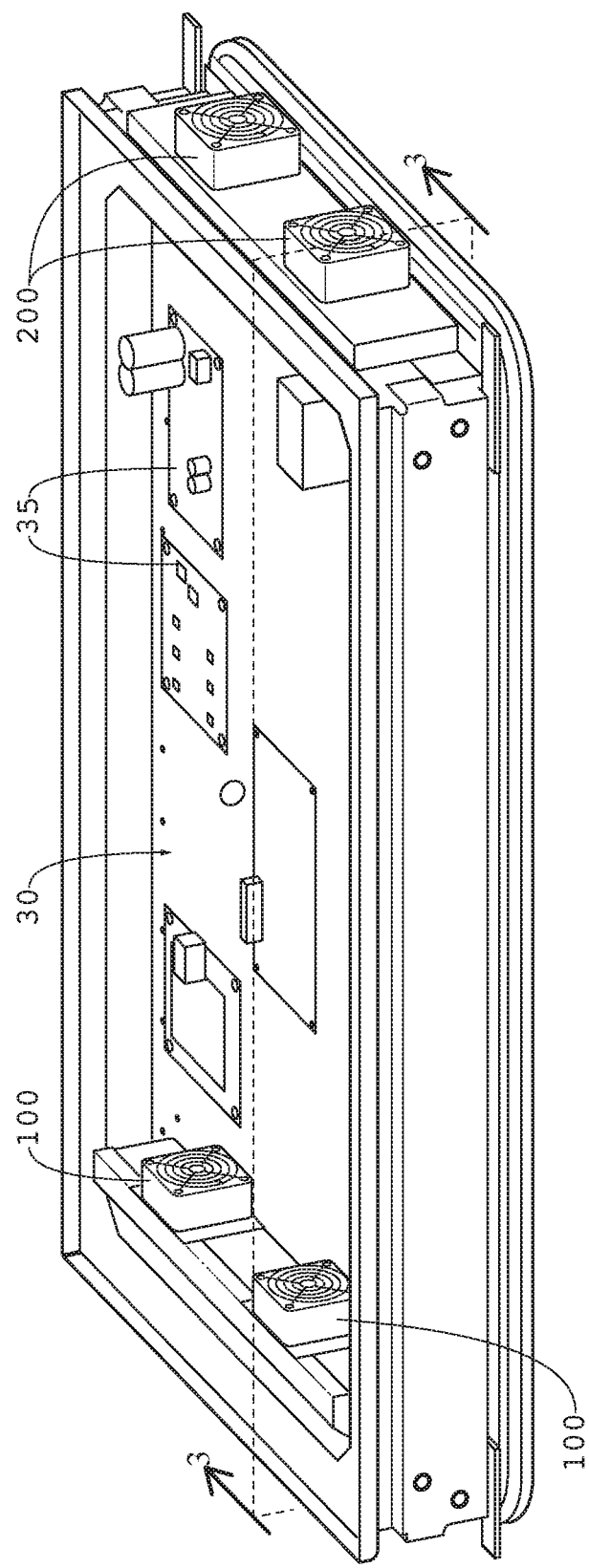
FIG. 2 is a side rear perspective view showing the overall assembly of the display with the rear cover removed and indicating the section line 3-3.

FIG. 2 is a side rear perspective view showing the overall assembly of the display with the rear cover removed and indicating the section line 3-3. In this particular embodiment, the display assembly is designed for a portrait orientation with the closed loop fans 100 positioned at the top of the assembly and the open loop fans 200 positioned at the bottom of the assembly. This is of course not required however, as the embodiments herein can be flipped or oriented for a landscape orientation if desired. Further, the open loop fans 200 do not have to be placed at the bottom of the assembly, but could be positioned anywhere so that the open loop air travels in the paths specified in these exemplary embodiments. It of course goes without saying that additional fans could also be used to increase flow rates and/or pressure.

Figure 3:
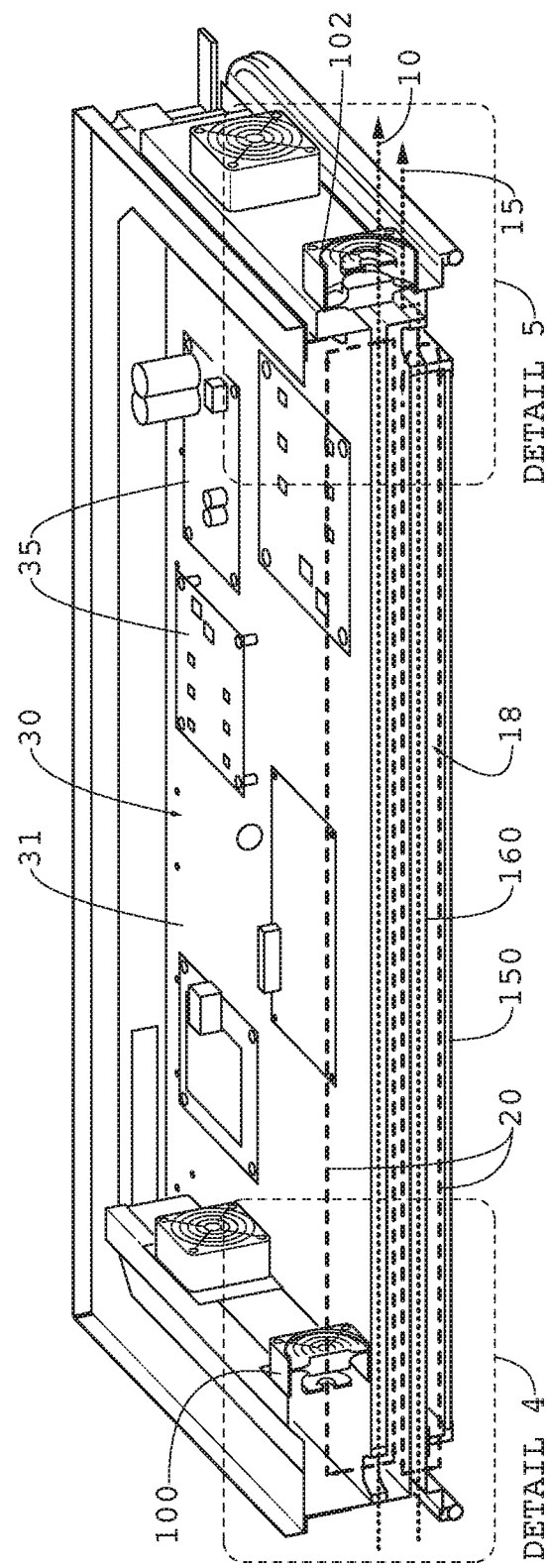
FIG. 3 is a perspective section view taken from the section line 3-3 and indicating the locations for Detail 4 and Detail 5.

FIG. 3 is a perspective section view taken from the section line 3-3 and indicating the locations for Detail 4 and Detail 5. Here, the front channel 18 is defined between the front transparent plate 150 and the electronic display 160. In an exemplary embodiment the electronic display 160 may be an LED backlit liquid crystal display (LCD), but this is not required. Alternative embodiments may utilize any type of flat panel electronic display, including but not limited to plasma, OLED, electroluminescent polymers, or similar. In some embodiments, the various electrical components 35 (power supplies, printed circuit boards, microprocessors, electronic storage, etc.) may be attached and in thermal communication with a plate 31 which may form the rear portion of channel 11 for open loop air 10. In this way, heat that is generated by the electrical components 35 may be transferred to the plate 31, where it can be removed by open loop air 10.

Figure 4:
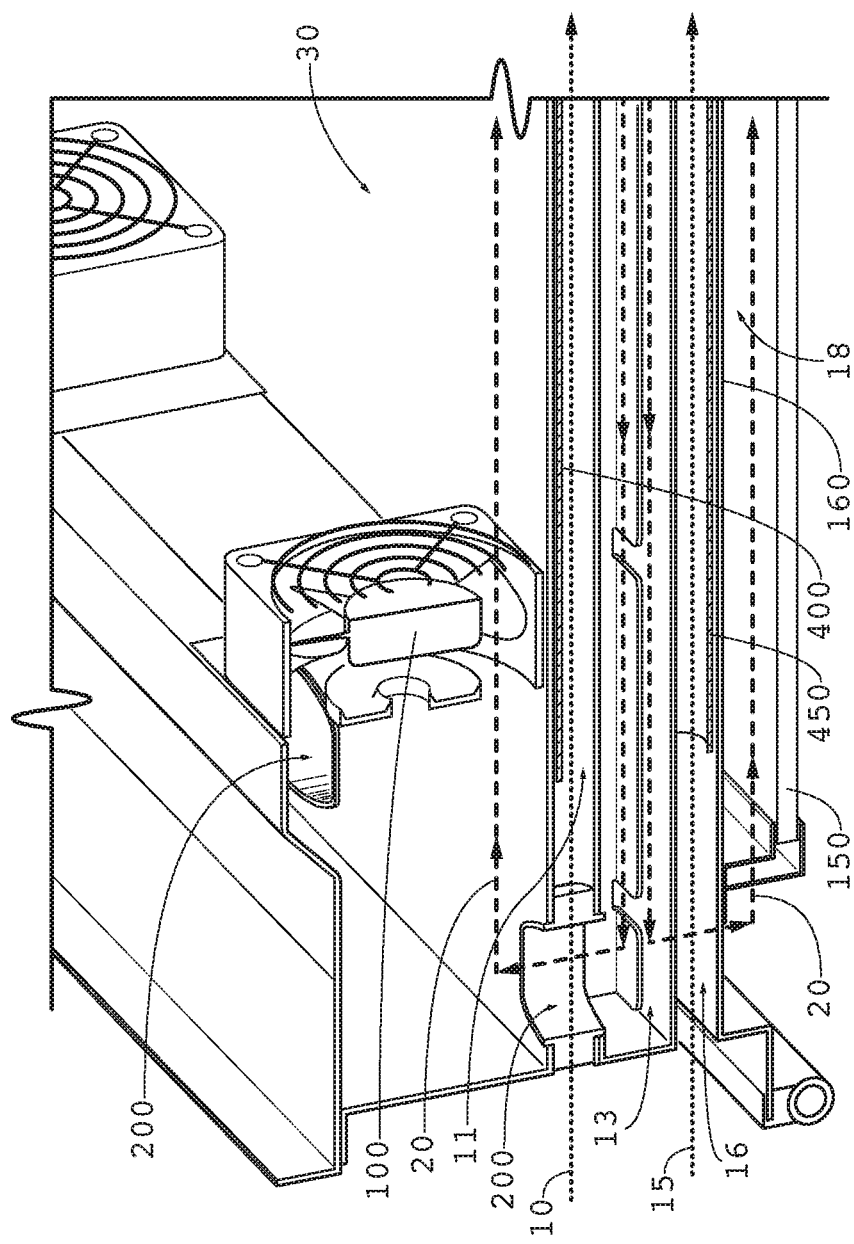
FIG. 4 is a detailed perspective section view of Detail 4.

FIG. 4 is a detailed perspective section view of Detail 4. Closed loop circulating gas 20 is permitted to pass through the rear open loop channel 11 without mixing with the open loop air 10 by use of pass-through apertures 200, which provide sealed gaseous communication between the rear channel 30 and the center channel 13, without permitting open loop air 10 to enter the channels 30 and 13. In an exemplary embodiment, rear open loop channel 11 may also contain cooling fins 400 for distributing heat from the adjacent channels (30 and 13) and/or electronic components 35 in order to be efficiently removed by the open loop air 10. Similarly, front open loop channel 16 may also contain cooling fins 450 for distributing heat from the adjacent channels (30 and 18) and/or the rear surface of the display 160 in order to be efficiently removed by the open loop air 15. In an exemplary embodiment, the display 160 contains a direct lit LED backlight where the cooling fins 450 are placed in thermal communication with the LED backlight. The cooling fins 450 and 400 may be comprised of any thermally conductive material, but would preferably be comprised of metal and in an exemplary embodiment would be a thin sheet (or multiple thin sheets) of metal.

Figure 5:
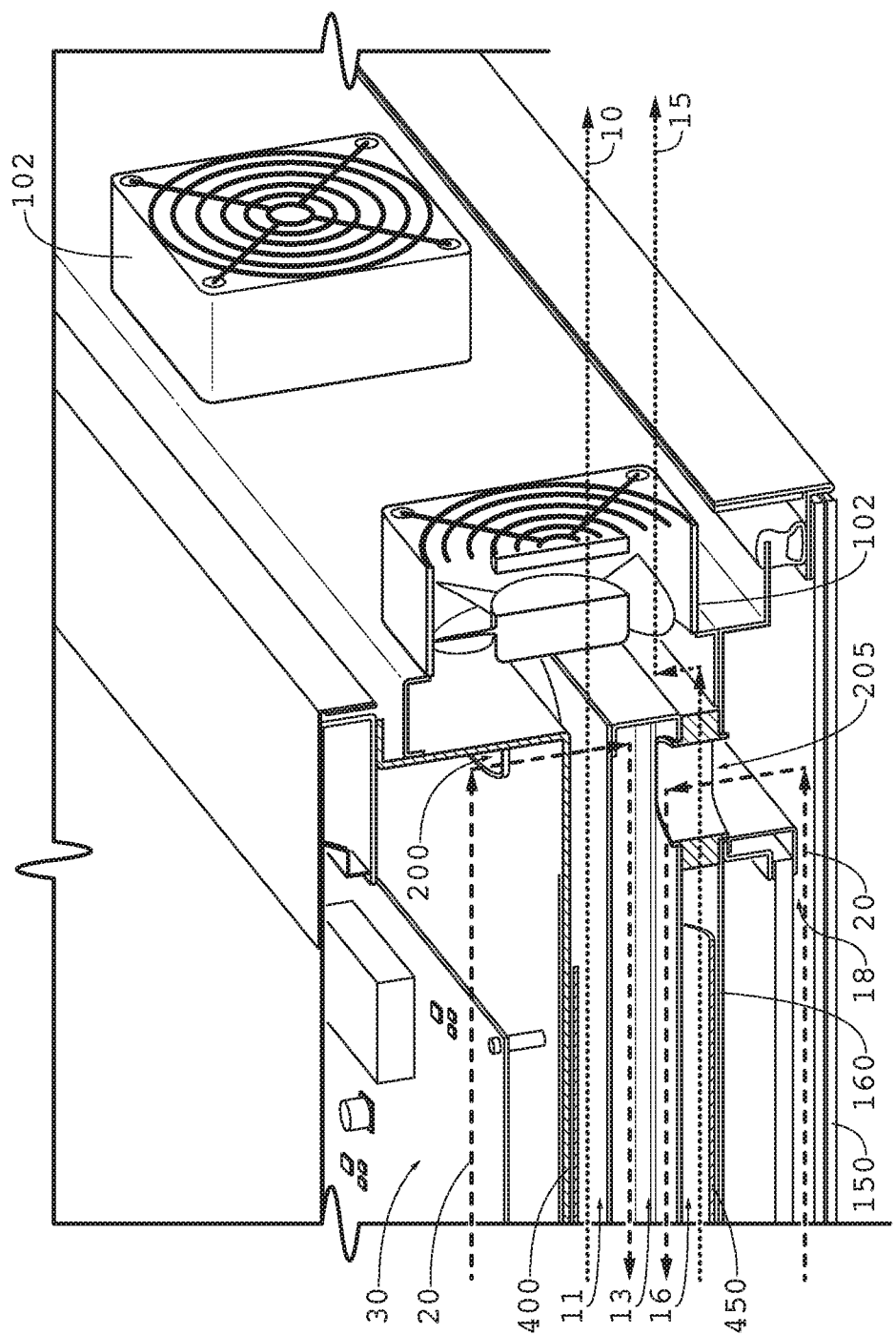
FIG. 5 is a detailed perspective section view of Detail 5.

FIG. 5 is a detailed perspective section view of Detail 5. Closed loop circulating gas 20 is permitted to pass through the front open loop channel 16 without mixing with the open loop air 15 by use of pass-through apertures 205, which provide sealed gaseous communication between the front channel 18 and the center channel 13, without permitting open loop air 15 to enter the channels 18 and 13.

Figure 6:
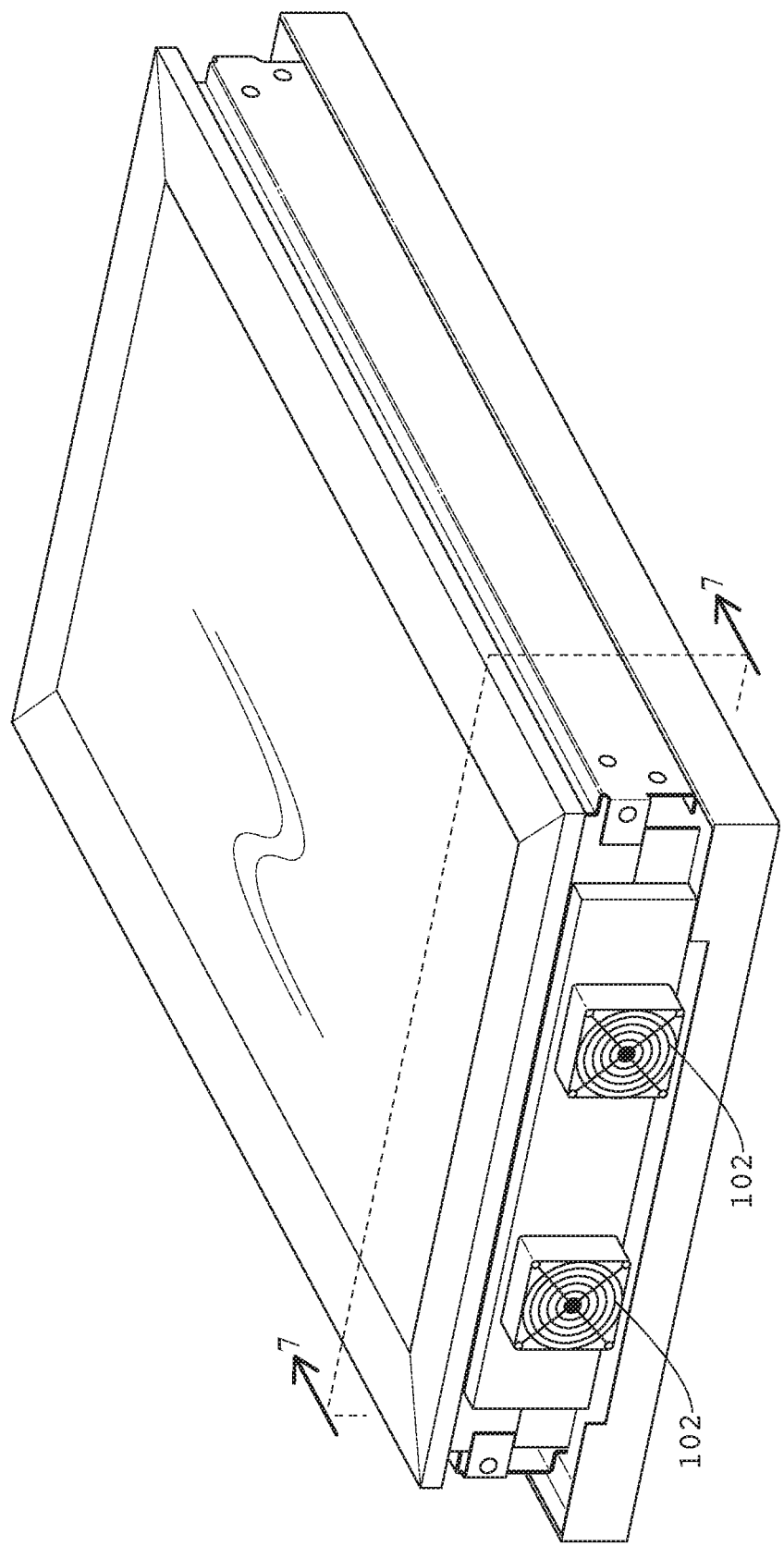
FIG. 6 is a bottom rear perspective view showing the overall assembly of the display and indicating the section line 7-7.

FIG. 6 is a bottom rear perspective view showing the overall assembly of the display and indicating the section line 7-7.

Figure 7:
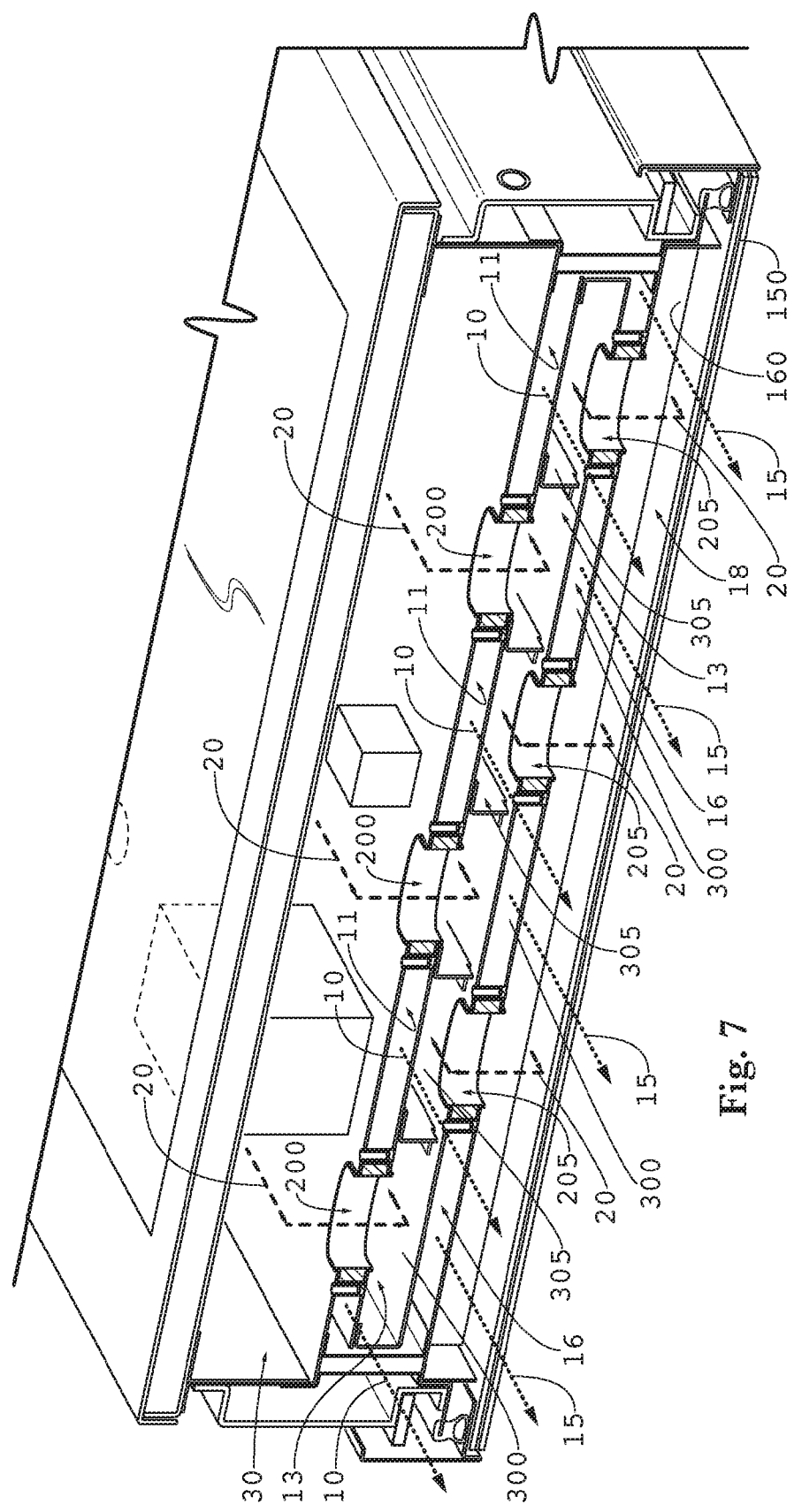
FIG. 7 is a perspective section view taken from the section line 7-7.

FIG. 7 is a perspective section view taken from the section line 7-7. The center channel 13 is preferably divided into a plurality of subchannels 300 and 305. On this end of the overall assembly, subchannels 300 are in gaseous communication with the pass-through apertures 200 (which connects the subchannel 300 with the rear channel 30) while subchannels 305 are in gaseous communication with the pass-through apertures 205 (which connects the subchannel 305 with the front channel 18). However, on the opposite end of the assembly (see FIG. 3) subchannels 300 are in gaseous communication with the pass-through apertures 205 (which connects the subchannel 300 with the front channel 18) while subchannels 305 are in gaseous communication with the pass-through apertures 200 (which connects the subchannel 305 with the rear channel 30). In this way, the closed loop of circulating gas 20 travels through the front channel 18, through a pass-through aperture to travel along subchannel 305, through another pass-through aperture to travel along the rear channel 30, through another pass-through aperture to travel along the subchannel 300, and finally through another pass-through aperture to return to the front channel 18. In this way, the closed loop of circulating gas 20 performs the 'figure eight' through the assembly, as it weaves its way across the front channel 18, through the center channel 13, across the rear channel 30, again through the center channel 13, and returning to the front channel 18.

It should be noted that subchannels 300 and 305 may not be required in some embodiments as the center channel 13 could be completely open. It should also be noted that other embodiments may use the subchannels 300 and 305 but would not allow a single subchannel to communicate gaseously with both the front channel 18 and the rear channel 30. In other words, when viewing the end of the assembly as shown in FIG. 7, the opposing end of the assembly would be substantially similar. Thus, subchannels 300 would only communicate with pass-through apertures 200 and the rear channel 30, while the subchannels 305 would only communicate with pass-through apertures 205 and front channel 18. Thus, in this embodiment there would be two separate closed loops.

Although there is preferably gaseous communication throughout the figure eight, subchannel 300 directs the flow of closed loop circulating gas 20 through rear channel 30 and center channel 13 while subchannel 305 directs the flow of closed loop circulating gas 20 through the center channel 13 and front channel 18. In this preferred embodiment, the subchannels 300 and 305 allow separate flow paths for closed loop circulating gas 20 within the center channel 13, without requiring additional fans. These separate flow paths which cross through the center and loop around the display in a single continuous flow, define the figure eight path for the closed loop circulating gas 20 (seen also in FIG. 1). Further, in this preferred embodiment, the flow direction of closed loop circulating gas 20 through the center channel 13 is opposite the flow direction of open loop air 15 and 10, creating a counter-flow heat exchanger between the center channel 13 and the front/rear open loop channels 11 and 16. However, this is not required, as a parallel flow or a cross flow design would work as well.

In an exemplary embodiment, the rear channel 30 would share a plate with the rear open loop channel 11, such that one side of the plate would be within the rear channel 30 while the opposing side of the plate would be within the rear open loop channel 11. This arrangement is illustrated in FIG. 3 with the rear plate 31. Similarly, it may be preferable for the center channel 13 and the rear open loop 11 to share a plate, such that one side of the plate is within the center channel 13 while the other side of the plate is within the rear open loop 11. Similarly, it may be preferable for the center channel 13 and the front open loop 16 to share a plate. Finally, it may also be preferable for the rear surface of the display 160 to form the front wall of the front open loop 16, such that open loop ambient air 15 can remove heat from the electronic display 160. In some embodiments the rear surface of the display 160 would be the rear surface of a metallic PCB holding a plurality of LEDs for the backlight.

Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

We claim:

1. A cooling assembly for an electronic display comprising:
    a figure eight closed loop of circulating gas pathways wrapping around the electronic display so as to cover at least a front portion of a viewable area of the electronic display; and
    an open loop ambient air pathway passing through the figure eight which does not allow circulating gas to mix with ambient gas.

2. The cooling assembly of claim 1 further comprising:
    a front channel defined between a front surface of the electronic display and a transparent plate;
    wherein the figure eight closed loop of circulating gas pathways includes the front channel.

3. The cooling assembly of claim 2 further comprising:
    a rear channel containing electronic components which are mounted to a rear plate;
    wherein the figure eight closed loop of circulating gas pathways includes the rear channel.

4. The cooling assembly of claim 3 further comprising:
    a center channel placed between the front channel and rear channel;
    wherein the figure eight closed loop of circulating gas pathways includes the center channel.

5. The cooling assembly of claim 1 wherein:
    the open loop ambient air pathway travels along a rear surface of the electronic display.

6. The cooling assembly of claim 3 wherein:
    the open loop ambient air pathway travels along a side of the rear plate which is opposite the side containing the electronic components.

7. The cooling assembly of claim 1 further comprising:
    a plurality of pass-through apertures placed within the figure eight closed loop of circulating gas pathways.

8. The cooling assembly of claim 7 wherein:
    the pass-through apertures are arranged such that the circulating gas travels through the center of the aperture while the open loop ambient air passes around the aperture.

9. The cooling assembly of claim 7 wherein:
    the pass-through apertures are arranged to prevent the circulating gas from mixing with the open loop ambient air.

10. A cooling assembly for an electronic display comprising:
    a closed loop of gas pathways for circulating gas comprising
        a front channel placed in front of the electronic display,
        a rear channel placed behind the electronic display, and
        a center channel placed between the front and rear channels;
    a first open loop pathway for ambient air positioned between the electronic display and the center channel; and
    a second open loop pathway for ambient air positioned between the center channel and the rear channel.

11. The cooling assembly of claim 10 further comprising:
    a closed loop fan positioned to force circulating gas through the closed loop of gas pathways; and
    an open loop fan positioned to force ambient air through the first and second open loop pathways.

12. The cooling assembly of claim 10 further comprising:
    a rear plate having a posterior and anterior side and placed within the rear channel;
    a plurality of electronic components attached to the posterior side of the rear plate; and
    wherein the anterior side of the rear plate forms a portion of the second open loop pathway.

13. The cooling assembly of claim 10 further comprising:
    a plurality of pass-through apertures positioned within the first open loop pathway.

14. The cooling assembly of claim 13 wherein:
    the pass-through apertures contain a hole in the center and are arranged such that the circulating gas travels through the hole in the center while the ambient air travels around the pass-through aperture.

15. The cooling assembly of claim 10 wherein:
    the second open loop pathway and the rear channel share a plate such that a side of the plate is within the rear channel while an opposing side of the plate is within the second open loop pathway.

16. The cooling assembly of claim 10 wherein:
    the center channel is placed between the first and second open loop pathways.

17. A cooling assembly for an electronic display comprising:
    a front channel defined by the space between a front surface of the electronic display and a transparent plate;

a first open loop pathway defined by the space between a rear surface of the electronic display and a front plate;

a rear plate positioned behind the electronic display and having a first side forming part of a rear channel and an opposing side forming part of a second open loop pathway;

a center channel placed between the first and second open loop pathways;

a closed loop fan positioned to force circulating gas through the front channel, rear channel, and center channel; and an open loop fan positioned to force ambient air through the first and second open loop pathways.

18. The cooling assembly of claim 17 further comprising:

a plurality of pass-through apertures placed within the path of the circulating gas.

19. The cooling assembly of claim 17 further comprising:

a plurality of electronic components attached to the side of the rear plate forming part of the rear channel.

20. The cooling assembly of claim 17 further comprising:

a plurality of cooling fins placed within the first and second open loop pathways.

\* \* \* \* \*